(12) United States Patent
Pang et al.

(10) Patent No.: US 11,519,561 B2
(45) Date of Patent: Dec. 6, 2022

(54) HIGH-YIELD LOW-COST LARGE-AREA FLEXIBLE OLED LIGHTING MODULE

(71) Applicant: BEIJING SUMMER SPROUT TECHNOLOGY CO., LTD., Beijing (CN)

(72) Inventors: Huiqing Pang, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 17/728,729

(22) Filed: Apr. 25, 2022

(65) Prior Publication Data

US 2022/0252225 A1    Aug. 11, 2022

Related U.S. Application Data

(62) Division of application No. 16/432,554, filed on Jun. 5, 2019, now Pat. No. 11,359,770.

(30) Foreign Application Priority Data

Jun. 6, 2018   (CN) .......................... 201810572632.3

(51) Int. Cl.
*F21K 9/90*      (2016.01)
*F21K 9/20*      (2016.01)
*F21V 19/00*    (2006.01)
*H01L 25/04*    (2014.01)
*H01L 51/52*    (2006.01)
(Continued)

(52) U.S. Cl.
CPC ................. *F21K 9/20* (2016.08); *F21K 9/90* (2013.01); *F21V 19/0025* (2013.01); *H01L 25/048* (2013.01); *H01L 51/5253* (2013.01); *H01L 51/5262* (2013.01); *H01L 51/56* (2013.01); *F21V 23/0442* (2013.01); *F21Y 2113/10* (2016.08); *F21Y 2115/15* (2016.08)

(58) Field of Classification Search
CPC ......... F21V 19/0025; F21V 9/90; H01L 51/56
USPC ........................................................ 362/231
See application file for complete search history.

(56) References Cited

U.S. PATENT DOCUMENTS 6,013,383 A    1/2000   Shi et al.
8,343,678 B2   1/2013   Ahn et al.
(Continued)

FOREIGN PATENT DOCUMENTS

CN    102082161 A    6/2011
CN    101265260 B    1/2014
(Continued)

OTHER PUBLICATIONS

K. Yamae et al., Realization of Outstandingly High Efficacy White OLED by Controlling Evanescent Mode and Wide Angular Incident Light, SID Digest, pp. 682-685 (2014); ISSN 0097-966X/14/4502-0682.
(Continued)

*Primary Examiner* — Christopher M Raabe
(74) *Attorney, Agent, or Firm* — Sandberg Phoenix & von Gontard PC

(57) ABSTRACT

The application relates to the field of OLED lighting, and provides a high-yield low-cost large-area flexible OLED lighting module, a manufacturing method thereof and an OLED lighting luminaire.

12 Claims, 13 Drawing Sheets

(51) Int. Cl.
*H01L 51/56* (2006.01)
*F21Y 113/10* (2016.01)
*F21Y 115/15* (2016.01)
*F21V 23/04* (2006.01)

(56) References Cited

U.S. PATENT DOCUMENTS

| | | | |
|---|---|---|---|
| 8,564,192 | B2 | 10/2013 | Pang et al. |
| 8,764,239 | B2 | 7/2014 | Burrows et al. |
| 8,836,223 | B2 | 9/2014 | Levermore et al. |
| 8,907,560 | B2 | 12/2014 | Levermore et al. |
| 8,927,308 | B2 | 1/2015 | Pang et al. |
| 8,933,468 | B2 | 1/2015 | Mandlik et al. |
| 9,018,660 | B2 | 4/2015 | Hack et al. |
| 9,041,297 | B2 | 5/2015 | Burrows et al. |
| 9,184,419 | B2 | 11/2015 | Mandlik et al. |
| 9,214,510 | B2 | 12/2015 | Ma et al. |
| 9,337,441 | B2 | 5/2016 | Ma |
| 9,343,678 | B2 | 5/2016 | Ko et al. |
| 9,397,312 | B2 | 7/2016 | Levermore et al. |
| 9,865,672 | B2 | 1/2018 | Krall et al. |
| 9,887,175 | B2 | 2/2018 | Aoyama et al. |
| 9,954,389 | B2 | 4/2018 | Yoshitani et al. |
| 2004/0100796 | A1 | 5/2004 | Ward |
| 2004/0174324 | A1 | 9/2004 | Yamazaki et al. |
| 2005/0207156 | A1 | 9/2005 | Wang et al. |
| 2005/0248935 | A1 | 11/2005 | Strip et al. |
| 2006/0244693 | A1 | 11/2006 | Yamaguchi et al. |
| 2007/0146242 | A1 | 6/2007 | Miller et al. |
| 2012/0201024 | A1 | 8/2012 | Van De Ven |
| 2012/0320574 | A1 | 12/2012 | Mathai et al. |
| 2013/0265232 | A1 | 10/2013 | Yun et al. |
| 2015/0144907 | A1* | 5/2015 | Lin ................... H01L 51/56 438/34 |
| 2015/0331508 | A1 | 11/2015 | Nho et al. |
| 2018/0198980 | A1 | 7/2018 | Takagi et al. |
| 2019/0013368 | A1 | 1/2019 | Chung et al. |
| 2019/0251879 | A1* | 8/2019 | Hall ................... G06F 1/188 |
| 2020/0263862 | A1* | 8/2020 | Bonne ............... F21V 23/006 |
| 2021/0192991 | A1* | 6/2021 | Hall ................... H05K 7/20 |

FOREIGN PATENT DOCUMENTS

| | | |
|---|---|---|
| CN | 105742511 B | 10/2017 |
| CN | 105409028 B | 12/2017 |
| CN | 103996799 B | 1/2018 |
| CN | 104576684 B | 1/2018 |
| CN | 102695364 B | 5/2018 |

OTHER PUBLICATIONS

Department of Energy; Solid-State Lighting—LED Basics; https://www.energy.gov/eere/ssl/led-basics; (7 pages), Accessed Jun. 5, 2019.

Miller et al.; OLED Lighting Products: Capabilities, Challenges, Potential; US Department of Energy—Energy Efficiency & Renewable Energy; May 2016; Pacific Northwest National Laboratory (PNNL-SA-25479); pp. 1-29 (36 pages).

LG Display—LG OLED Light; OLED Light Panel—User Guide V3.0; pp. 1-22 (23 Pages total).

B. Young; Presentation Slides—Cost of Ownership Model for OLE SSL (Solid-State Lighting); OLED Association; 2014 DOE Solid-State Lighting Manufacturing R&D Workshop; San Diego, California; May 12, 2014; pp. 1-11.

Schuichiro, Ogawa, Organic Electronics Materials and Devices, Asahi Kasei Corporation, Fuji, Japan, ISBN 978-4-431-55653-4, DOI 10.1007/978-4-431-55654-1; 2015 (15 pages).

\* cited by examiner

HIGH-YIELD LOW-COST LARGE-AREA FLEXIBLE OLED LIGHTING MODULE

CROSS-REFERENCES TO RELATED APPLICATIONS

This application is a division of U.S. application Ser. No. 16/432,554 titled "A HIGH-YIELD LOW-COST LARGE-AREA FLEXIBLE OLED LIGHTING MODULE" filed on Jun. 5, 2019, which claims priority to Chinese Patent Application No. 201810572632.3 filed on Jun. 6, 2018, and the entirety of each of which is incorporated herein by reference.

TECHNICAL FIELD

The present disclosure relates to an organic light emitting device (OLED) luminaire and, in particular, to a high-yield low-cost large-area flexible OLED lighting module, a manufacturing method thereof and an OLED lighting luminaire including the lighting module.

BACKGROUND

OLED lighting has gained a lot of attention in recent years, owing to its high efficacy, cold emission and novel form factor. Recent progress on light outcoupling innovation was reported to achieve over 130 lm/W for OLED panels (K. Yamae, et al., SID Digest, 682 (2014)). Commercialized LG Display's rigid panels can also reach up to 90 lm/W at 3000K (LG Display: OLED light panel user guide v3.0). This is already comparable with LEDs typical at 70-100 lm/W (https://www.energy.gov/eere/ssl/led-basics). LG Display's Luflex series are OLED lightings built on flexible substrates, with various sizes up to 300 mm×300 mm Multiple demonstrations and products utilizing such OLED panels can be seen on market (see FIGS. 1a to 1c). However, OLED lighting is still too expensive compared with other luminaires such as LEDs, fluorescent lamps, and incandescent bulbs. For example, a LG OLED sky desk lamp sells for 255.99 dollars, a Vela OLED wall sconce sells for 2,590 dollars and 9,990 dollars for a chandelier. However, a TaoTronics LED desk lamp is only sold at 27.99 dollars, and even a Blackjack LED surface light is sold at 359 dollars (www.amazon.com). This greatly hinders the commercialization progress of OLED lighting, and limits it in high-end, luxury applications. Furthermore, large surface luminaire or even flexible luminaire assembled by multiple LEDs can already be found in the market, which further shrinks the gap between these two types of luminaires, and adds challenge for OLEDs to enter general lighting industry.

It is believed that the high cost of OLED lighting comes from high cost of organic material (especially materials used in emissive layers), the manufacturing cost, and above all, the low production yield. One straight forward way to reduce the manufacturing cost is to increase the mother substrate size so as to provide more panels per batch. Although the initial investment for newer generation production line may be high, it has been calculated that over 5 years, the difference between the cost per substrate between a 6" tool (a tool processes substrate size up to 6") and 5.5$^{th}$ generation line is negligible (Barry Young, Cost of Ownership Model for OLED SSL). However, this approach does not solve the yield problem. The low yield is mostly caused by particles that can easily short the anode and cathode of an OLED device, causing a damage of the entire panel. To reduce the impact of particles, a method is proposed by inserting fuses (as disclosed in U.S. Pat. No. 8,836,223B2). Another method is to increase organic layer thickness by constructing a tandem structure. Fuse incorporation is helpful. However, fuse incorporation is limited in some cases. For example, when more than 1% pixels are short out, the entire panel is considered failure. Tandem structure does hinder certain sizes of particles, but has no effect for particles with a diameter size greater than 500 nm. And flexible OLED lighting is much more susceptible to particles, because even if the particles fall on top of a completed organic stack of the flexible OLED lighting, the particles still can penetrate through the thin-film encapsulation layer, resulting in reduced device lifetime. Other efforts focus on further improving device performance, including efficiency and lifetime to reduce S/lm, as well as building devices on the flexible substrate by low-cost roll-to-roll fabrication technique. However, device performance is improved relatively slower than the cost reduction of LEDs, and low efficiency and short lifetime of the flexible lighting is still a huge problem.

It is to be noted that, the present disclosure focuses on general lighting application, which fundamentally differs from those based on display or passive matrix as described in U.S. Pat. No. 9,954,389B2. As disclosed in U.S. Pat. No. 9,954,389B2, each pixel in the display or passive matrix has its own driving circuit. Although the pixels are arranged in array, they are all fabricated on one substrate and the size of the substrate is several orders of magnitude smaller than a single piece of substrate described in the present application. Even though flexible printed circuit sheets may be used for driving the OLEDs in U.S. Pat. No. 9,954,389 B2, the circuits in the display application are much more complicated and the OLEDs are all fabricated on one substrate.

Current trend of commercialized OLED luminaires is to create OLED panels with as large lighting area as possible on one single substrate, and then use one or more of these panels to construct luminaires Some luminaires using commercialized OLED panels are demonstrated in FIGS. 1a to 1c. Herein, all OLED panels, regardless of size, are provided by LG Chem in a module format. A "module" refers to an electrical device with only one set of external electrical driving apparatus. As shown in FIG. 2a, for these OLED modules of LG Chem, a pair of electrical wires are extended outside the panels and joined in a plug for ease of use. Power driver may also be provided, such as pulse width modulation and amplitude modulation shown in FIG. 2b. Each of these modules is essentially an OLED panel hooked up with external wires. Such module or an individual panel, still suffers low yield and high cost due to its large emissive area.

Recent progress on micro display is able to arrange LEDs in arrays on the substrate (US20050207156A1). However, in order to reach high resolution, these LEDs are arranged closely (as shown in FIG. 3a). Also, these LEDs are very small and are not applicable to large-area lighting. Some ideas are proposed to arrange OLEDs and LEDs alternately (U.S. Pat. No. 9,887,175B2) for lighting application (as shown in FIG. 3b). In such arrangement, there exists a space between the OLEDs for placing LEDs, thereby providing point luminaire effects. In addition, the OLED provided in U.S. Pat. No. 9,887,175B2 requires two substrates and sealant for encapsulation (i.e., traditional cover glass encapsulation) which will reduce the fill factor. In the present disclosure, no LED is involved, and a dedicated strategy for maximizing the fill factor and achieving an effective seal is introduced. A tiled flat panel lighting described in US 2005/0248935A1 aims at forming a compact OLED panel arrays by pre-designing a contact electrode so that OLED panels interconnect with each other at edges thereof (as shown in FIG. 3c). In the OLED panel arrays as disclosed in US 2005/0248935A1, each panel has at least two contact electrodes of the same polarity and a specific connection. On the contrary, in the present application, there is no specific requirement on contact electrodes, and there is no need for circuit connection between neighboring panels. In particular, electrodes of these OLED panels are interconnected by means of soldering, wire bonding, special reciprocal frames, etc, rather than using a common flexible printed circuit sheet as employed in our work. Furthermore, in US 2005/0248935A1, the substrate and Flexible Printed Circuit board (FPC) cannot exist at the same time. If the FPC is used as substrate material, multiple FPC sheets should be used and each FPC sheet only overlaps with one OLED. On the contrary, in the present disclosure, the substrate and the FPC co-exist and have different functions, and one FPC sheet overlaps with multiple OLEDs.

Finally, U.S. Pat. No. 9,337,441B2 discloses an OLED lighting system in which multiple OLEDs share one cover. The cover provides external electrical connection (as shown in FIG. 3d). The core idea here is to cut a mother panel into different groups of closely packed OLEDs, and all these OLEDs from one cover share the same substrate. On the contrary, in the present disclosure, each OLED panel is diced so that their substrates are separated from each other. The advantage is to be able to screen out defective panels and assemble the good ones so that the yield of OLED module is improved, which cannot be achieved by the structure as provided in U.S. Pat. No. 9,337,441 B2 where all panels share the same substrate. In addition, in the present disclosure, these panels are intentionally placed with intervals so that there is a gap between the substrates. In this way, although the individual panel is manufactured on the rigid substrates, large-area flexible tiles can still be achieved. The structure claimed in U.S. Pat. No. 9,337,441B2 may achieve the large-area flexible lighting only when the entire substrate is flexible, which is known to suffer low yield.

SUMMARY

The present disclosure aims to provide an OLED lighting module, a manufacturing method thereof and an OLED lighting luminaire including the lighting module to solve at least part of the problems described above. The OLED lighting module, the manufacturing method thereof and the OLED lighting luminaire including the lighting module provided by the present disclosure may achieve high-yield, low-cost and large-area flexible lighting.

An embodiment of the present disclosure provides an OLED lighting module, including:

a plurality of OLED panels, where each of the OLED panels includes a substrate, an OLED device, an encapsulation layer, at least one anode contact, and at least one cathode contact;

a first flexible printed circuit sheet, including a first surface, a second surface, and a first circuit printed on the first surface;

where at least one anode contact and at least one cathode contact of at least two OLED panels are electrically connected to the first circuit on the first surface of the first flexible printed circuit sheet, so that the plurality of OLED panels are electrically accessed externally;

where the substrates of the at least two OLED panels are separated from each other.

According to an embodiment of the present disclosure, each of the OLED panels has at least one light-emitting surface.

According to an embodiment of the present disclosure, the OLED lighting module further includes a light extraction layer.

According to an embodiment of the present disclosure, the light extraction layer in the OLED lighting module is a diffuser sheet and is attached to at least one light-emitting surface of at least one of the OLED panels.

According to an embodiment of the present disclosure, the light extraction layer in the OLED lighting module extends outside of the light-emitting surface of at least one of the OLED panels.

According to an embodiment of the present disclosure, the light extraction layer in the OLED lighting module is attached to at least a portion of the first flexible printed circuit sheet.

According to an embodiment of the present disclosure, the encapsulation layer in the OLED lighting module is a thin-film encapsulation layer.

According to an embodiment of the present disclosure, the encapsulation layer in the OLED lighting module is a cover glass glued to the substrate According to an embodiment of the present disclosure, the substrate of at least one of the OLED panels in the OLED lighting module is flexible.

According to an embodiment of the present disclosure, the OLED lighting module further includes one or more sensors, and at least one sensor is placed in between two OLED panels.

According to an embodiment of the present disclosure, the sensor in the OLED lighting module includes one or more of the following: a motion sensor, an image sensor, a sound sensor, a temperature sensor, a gas sensor, a humidity sensor, or an infrared sensor.

According to an embodiment of the present disclosure, the plurality of OLED panels further include a first OLED panel emitting light with a first peak wavelength, a second OLED panel emitting light with a second peak wavelength, where a difference between the first peak wavelength and the second peak wavelength is at least 10 nm.

According to an embodiment of the present disclosure, the plurality of OLED panels further include a third OLED panel. The first OLED panel emits light with the first peak wavelength between 400-500 nm, the second OLED panel emits light with the second peak wavelength between 500-580 nm, and the third OLED panel emits light with a third peak wavelength between 580-700 nm.

According to an embodiment of the present disclosure, the OLED light module further includes a supporting film. The supporting film is attached to at least a portion of the first flexible printed circuit sheet on a side opposite to the emitting surface.

According to an embodiment of the present disclosure, the first flexible printed circuit sheet is overlapped with only a portion of the OLED panel.

According to an embodiment of the present disclosure, the first flexible printed circuit sheet is overlapped with at least two of the OLED panels.

According to an embodiment of the present disclosure, the first flexible printed circuit sheet is electrically connected to the OLED panels through conductive adhesive.

According to an embodiment of the present disclosure, the OLED light module further includes a second circuit printed on the second surface of the flexible printed circuit sheet. At least one of the OLED panels is electrically connected to the first surface and at least another one of the OLED panels is electrically connected to the second surface of the first flexible printed circuit sheet.

According to an embodiment of the present disclosure, at least one of the OLED panels is electrically addressed independently.

According to an embodiment of the present disclosure, the plurality of OLED panels have same or different geometric shapes.

According to an embodiment of the present disclosure, at least two of the OLED panels are diced from two mother substrates.

According to an embodiment of the present disclosure, at least one of the first surface or the second surface of the first flexible printed circuit sheet is pre-coated with a thin-film encapsulation layer.

According to an embodiment of the present disclosure, the plurality of OLED panels are not uniformly distributed on the first flexible printed circuit sheet.

According to an embodiment of the present disclosure, the OLED light module further includes a second flexible printed circuit sheet, and a plurality of OLED panels are electrically connected to the second flexible printed circuit sheet. The first flexible printed circuit sheet and the second flexible printed circuit sheet are attached, such that at least one OLED panel on the first flexible printed circuit sheet emits light in a first direction and at least one OLED panel on the second flexible printed circuit sheet emits light in a second direction, where the first direction is opposite to the second direction.

According to an embodiment of the present disclosure, the first flexible printed circuit sheet is less than 1 mm thick.

According to an embodiment of the present disclosure, the first flexible printed circuit sheet further includes a flexible substrate. The flexible substrate is selected from a group consisting of: plastic, thin film glass, a thin metal foil coated with insulator, fabric, leather, paper, and combinations thereof.

According to an embodiment of the present disclosure, the substrates of at least two OLED panels have a space greater than 0.1 mm in between.

Another embodiment of the present disclosure provides a method for manufacturing an OLED lighting module, including:
a) determining an active area of one OLED panel;
designing panel layout;
b) designing panel distribution;
designing a corresponding circuit for the panel distribution;
printing the designed circuit on a first surface of a first flexible printed circuit sheet;
c) fabricating a plurality of OLED panels on at least one mother substrate;
encapsulating the plurality of OLED panels;
dicing the at least one mother substrate into individual OLED panels;
d) electrically bonding at least two individual OLED panels on the first surface of the flexible printed circuit sheet, where the OLED panels is able to be addressed externally;
where the substrates of at least two OLED panels have a space greater than 0.1 mm in between;
and step b may be implemented before, after or at the same time with step c in the method.

According to another embodiment of the present disclosure, the active area of the OLED panel is determined by an equation: $A=929M^{-2/3}$, where the active area, A, of the OLED panel is in a unit of cm$^2$, M is an average count of particles, the diameter of which is over X µm, per cubic feet, and X is between 0.1-0.5.

According to an embodiment of the present disclosure, the method further includes providing a light extraction layer.

According to an embodiment of the present disclosure, the light extraction layer is a diffuser sheet and is attached to at least one emitting surface of at least one OLED panel.

According to an embodiment of the present disclosure, the light extraction layer extends outside n light-emitting surface of at least one OLED panel.

According to an embodiment of the present disclosure, the light extraction layer is attached to at least a portion of the first flexible printed circuit sheet.

According to an embodiment of the present disclosure, the plurality of OLED panels are thin-film encapsulated.

According to an embodiment of the present disclosure, the substrate of at least one OLED panel is flexible.

According to an embodiment of the present disclosure, the method further includes assembling one or more sensors in between two OLED panels on the flexible printed circuit sheet.

According to an embodiment of the present disclosure, the sensor includes one or more of the following: a motion sensor, an image sensor, a sound sensor, a temperature sensor, a gas sensor, a humidity sensor, or an infrared sensor.

According to an embodiment of the present disclosure, the plurality of OLED panels further include a first OLED panel emitting light with a first peak wavelength, a second OLED panel emitting light with a second peak wavelength. A difference between the first peak wavelength and the second peak wavelength is at least 10 nm.

According to an embodiment of the present disclosure, the plurality of OLED panels further include a third OLED panel. The first OLED panel emits light with the first peak wavelength between 400-500 nm, the second OLED panel emits light with the second peak wavelength between 500-580 nm, and the third OLED panel emits light with a third peak wavelength between 580-700 nm.

According to an embodiment of the present disclosure, the OLED light module further includes a supporting film. The supporting film is attached to at least a portion of a side of the first flexible printed circuit sheet that is not connected to the OLED panels.

According to an embodiment of the present disclosure, the first flexible printed circuit is overlapped with only a portion of the OLED panel.

According to an embodiment of the present disclosure, the first flexible printed circuit is electrically connected to the OLED panels through conductive adhesive.

According to an embodiment of the present disclosure, at least one OLED panel is electrically addressed independently.

According to an embodiment of the present disclosure, the first flexible printed circuit sheet is less than 1 mm thick.

According to an embodiment of the present disclosure, the plurality of OLED panels are fabricated from two or more mother substrates.

According to an embodiment of the present disclosure, the plurality of OLED panels are pre-screened before assembled on the first flexible printed circuit sheet.

According to an embodiment of the present disclosure, the first flexible printed circuit sheet further includes a flexible substrate. The flexible substrate is selected from a group consisting of: plastic, thin film glass, a thin metal foil coated with insulator, fabric, leather, paper, and combinations thereof.

Yet another embodiment of the present disclosure provides an OLED luminaire including at least one of the OLED light module described above.

In the new OLED lighting module disclosed by the present disclosure, the substrates of the OLED panels included in the OLED lighting module are separated from each other. Therefore, it means that the OLED panels may come from different mother substrates, for example, different mother substrates manufactured by different materials, reducing the cost. Meanwhile, one mother substrate, relative to cutting a unit including multiple OLED panels, may cut more signal OLED panel units. Screening good units from the obtained more signal OLED panel units and assembling will improve the yield of the OLED lighting module. Moreover, these OLED panels in the OLED lighting module are spaced apart from each other, so that substrates have a certain space, and large-area flexible lighting may be implemented by using the panels manufactured on rigid substrates, which compared with the large-area flexible lighting implemented by having to use full flexible substrates, improves the yield and reduces the cost.

BRIEF DESCRIPTION OF DRAWINGS

FIG. 2b is a diagram illustrating a power driver for driving an OLED module shown in FIG. 2a;

DETAILED DESCRIPTION

Figure 1A:
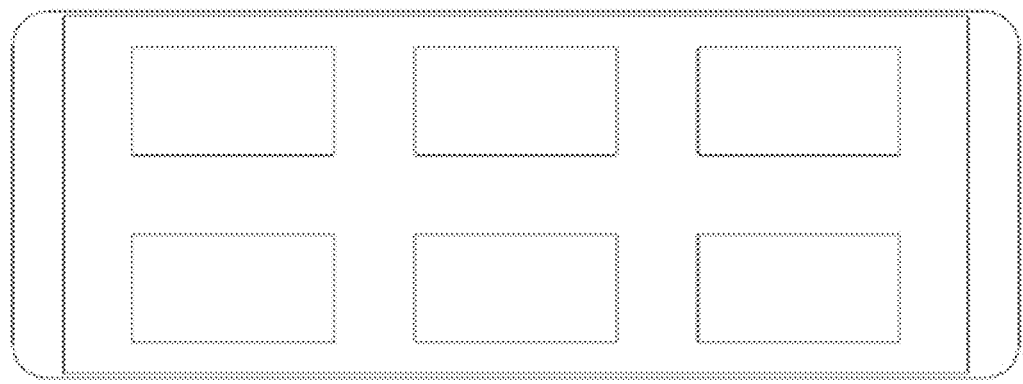
FIGS. 1a to 1c are diagrams illustrating an OLED luminaire using multiple OLED panels, where each of the panels is a module.
Figure 1B:
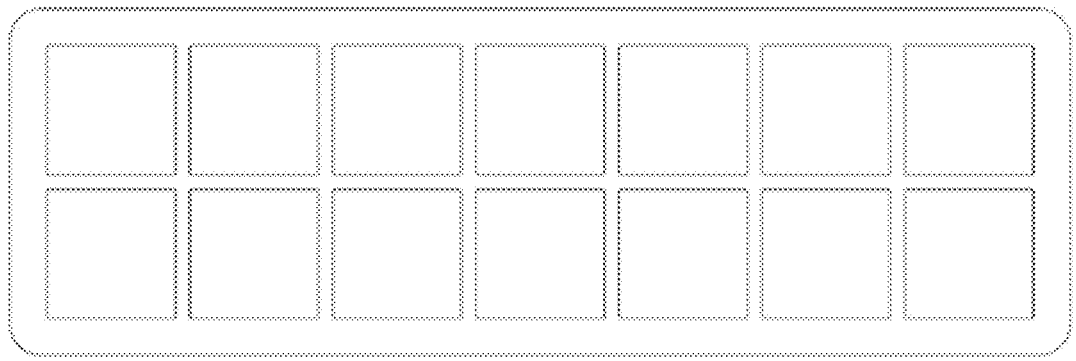
Figure 1C:
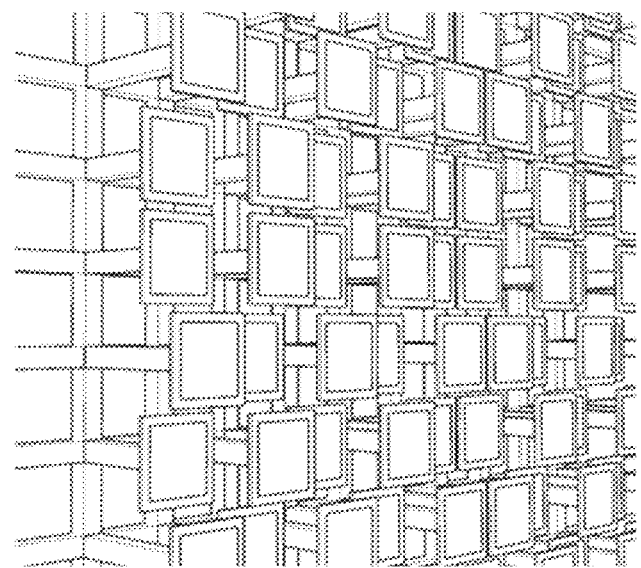
Figure 2A:
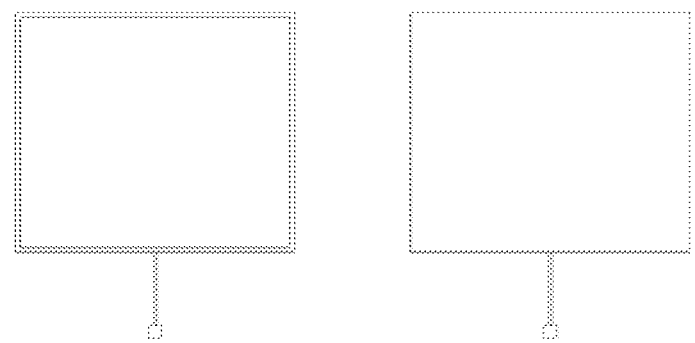
FIG. 2a is a diagram illustrating an emitting surface and a back surface of each module of an OLED luminaire shown in FIGS. 1a to 1c.
Figure 2B:
Figure 3A:
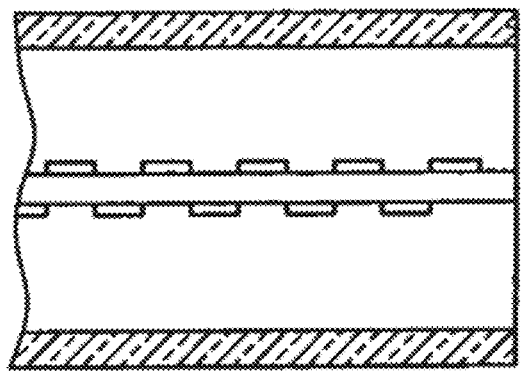
FIG. 3a is a schematic diagram illustrating a micro display formed by closely packed LED arrays.
Figure 3B:
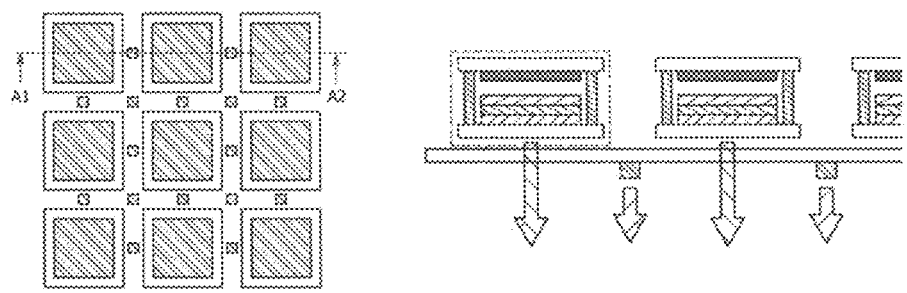
FIG. 3b is a schematic diagram illustrating a lighting device including multiple OLEDs and LEDs.
Figure 3C:
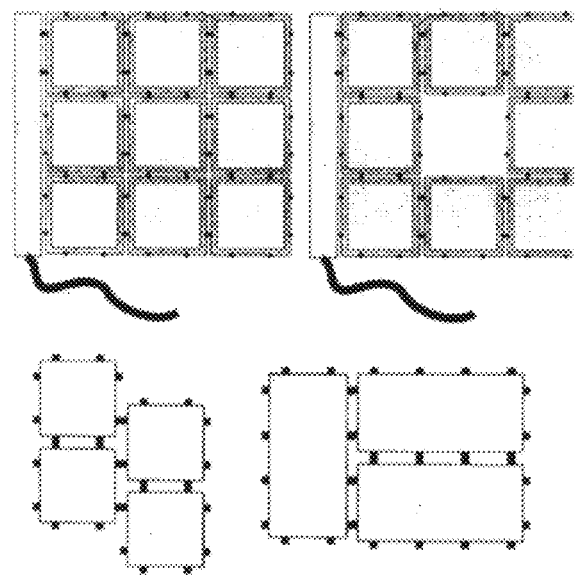
FIG. 3c is a schematic diagram illustrating a tiled flat panel lighting system including lighting units that are electrically interconnected to each other on panel edges.
Figure 3D:
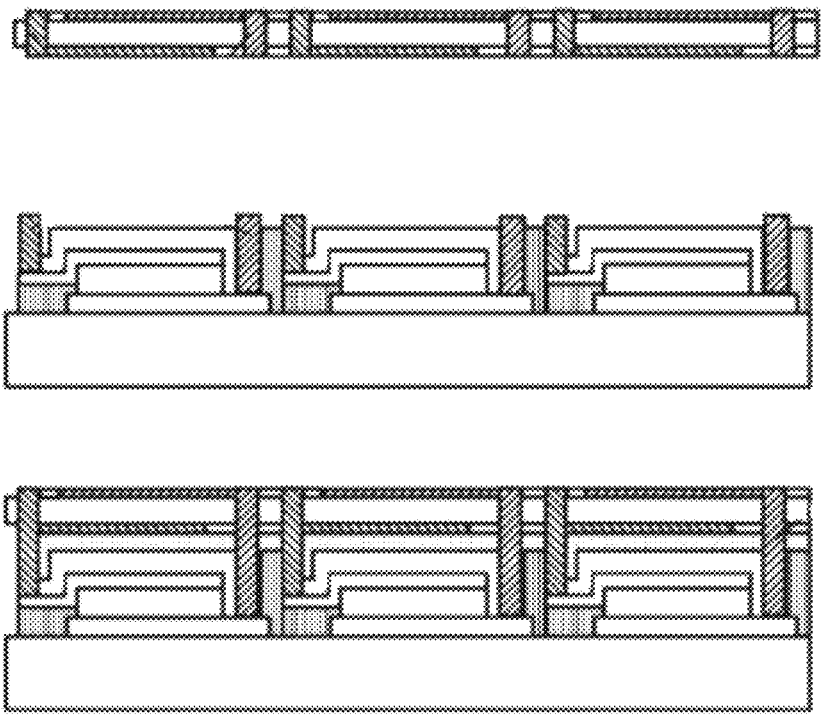
FIG. 3d is a schematic diagram illustrating an OLED lighting system including multiple OLED units where the multiple OLED units share a cover and electrical contacts are electrically connected to the cover.

As used in the present disclosure, "top" means the farthest from a substrate, and "bottom" means the closest to the substrate. If a first layer is described as being placed "on" a second layer, it means that the first layer is placed far away from the substrate. Unless the first layer is specified to be in contact with the second layer, another layer may exist between the first layer and the second layer. For example, even if various organic layers are provided between a cathode and an anode, the cathode may still be described as "being placed on" the anode.

As used herein, the term "OLED panel" includes a substrate, an OLED device, an encapsulation layer, and at least one anode contact and at least one cathode contact extending outside of the encapsulation layer for electrical driving. The OLED device includes an anode layer, a cathode layer, one or more organic light-emitting layers placed between the anode layer and the cathode layer. The OLED device does not include the substrate and the encapsulation layer that are already presented in the OLED panel.

As used herein, the term "module" refers to an electrical device with only one set of external electrical driving apparatus.

As used herein, the term "encapsulation layer" may be a thin-film encapsulation layer with a thickness less than 100 micrometers, including one or more thin films directly coated on the surface of the device, or may be a cover glass glued to the substrate.

As used herein, the term "active area" refers to a light-emitting area when the OLED device is powered. The active area may have a regular shape or an irregular shape.

As used herein, the term "separate" refers to two objects that are physically unconnected and do not form a coherent object.

As used herein, the term "fill factor" refers to an area ratio of the light-emitting area and the entire panel.

As used herein, the term "flexible printed circuit (FPC)" refers to any flexible substrate coated with at least one of the following or the combination thereof: including, but not limited to: a conductive line, a resistor, a capacitor, an inductor, a transistor, and a Micro-electromechanical System (MEMS). The substrate of the flexible printed circuit may be plastic, thin film glass, thin metal foil coated with insulator, fabric, leather, paper and so on. The thickness of one piece of the flexible printed circuit generally is less than 1 mm and more preferably, less than 0.7 mm.

As used herein, the term "light extraction layer" may refer to a light diffusion sheet or a micro-structure for light extracting, and may also be a thin-film layer having a light extracting effect. The light extraction layer may be located on a surface of the substrate of the OLED panel, and may also be located at other suitable positions, such as between the substrate and the anode, or between the organic layer and the cathode/anode, or between the cathode and the encapsulation layer or over the surface of the encapsulation layer.

As used herein, the OLED lighting module includes multiple OLED panels. Specifically, the OLED lighting module includes at least two OLED panels and the maximum number of the OLED panels may be set according to the needs of use.

Although it is natural to improve yield by reducing active area, rarely reported is a guideline on how to determine the maximum active area. Herein, the first rule of thumb in determining a suitable active area for OLEDs is described. Usually, OLED lighting is fabricated in a cleanroom. Specifically, an anode layer and a bank layer (which usually is macromolecule polymer, such as polyimide, used to cover the edge of ITOs so as to prevent ITO spikes penetrating through organic layers) are patterned in class 100 cleanroom, while organic layers, a cathode layer and an encapsulation layer are patterned in class 1000 cleanroom. Sometimes, the anode layer may also be patterned in a sputter chamber using a shadow mask, and in this case, all processes may be completed in class 1000 cleanroom (U.S. Pat. No. 8,564,192B2). In a mass production factory, more preferably, all processes may be completed in class 100 cleanroom. Particles (if there is any) introduced from ITO and the bank layer may distort the pattern, and usually may be removed and rarely impact the yield of the final device. On the contrary, particles introduced during organic layer deposition process are most critical because they are able to short the entire device. The standard of class 100 cleanroom is that the number of particles, the diameter of which is greater than 0.5 µm, per cubic feet is less than 100. That means, assuming that particles are uniformly distributed in the space, there are less than 21.54 particles, the diameter of which is greater than 0.5 µm, per square feet, i.e. 0.023/cm². Therefore, in theory, in a class 100 cleanroom, there is no particle the diameter of which is greater than 0.5 µm in an area less than 43 cm². This is the theoretical maximum threshold for the active area where there is no particle the diameter of which is greater than 0.5 µm. A tandem structure OLED may easily have organic layers up to 0.5 µm in thickness. So, if the active area of a tandem OLED is controlled to be less than a particle-free threshold, the yield may be over 90% and up to 100% theoretically. Similarly, it may be deduced that in the class 1000 cleanroom (the number of particles, the diameter of which is greater than 0.5 µm and less than 5 µm, is less than 1000 per cubic feet, and the number of particles, the diameter of which is greater than 5 µm, is less than 250 per cubic feet), the maximum area where there is no particle the diameter of which is greater than 0.5 µm is 8 cm². For a thinner OLED device, usually organic layers range from 100 nm-300 nm, therefore, preferably, the active area should be half of the threshold area to ensure the high yield. Alternatively, a finer particle measurement is performed in the lab in order to decide the particle-free threshold area for a certain device structure. For example, particle the diameter of which is greater than 0.3 µm may be measured and the threshold area may be calculated accordingly.

A general formula may be deduced as follows: if particle the diameter of which is greater than X µm is counted less than M per cubic feet, where X is between 0.1 and 0.5 (more preferably, between 0.3 and 0.5), the threshold of active area A (cm²) for a high-yield OLED panel may be calculated as:

$$A = 929 M^{-2/3} [\text{cm}^2] \qquad \text{Eq. 1}$$

Calculating the threshold of active area in such a way also benefits thin-film encapsulated (TFE) devices, preventing particles falling in TFE layers which shorts the lifetime of the device.

Figure 4:
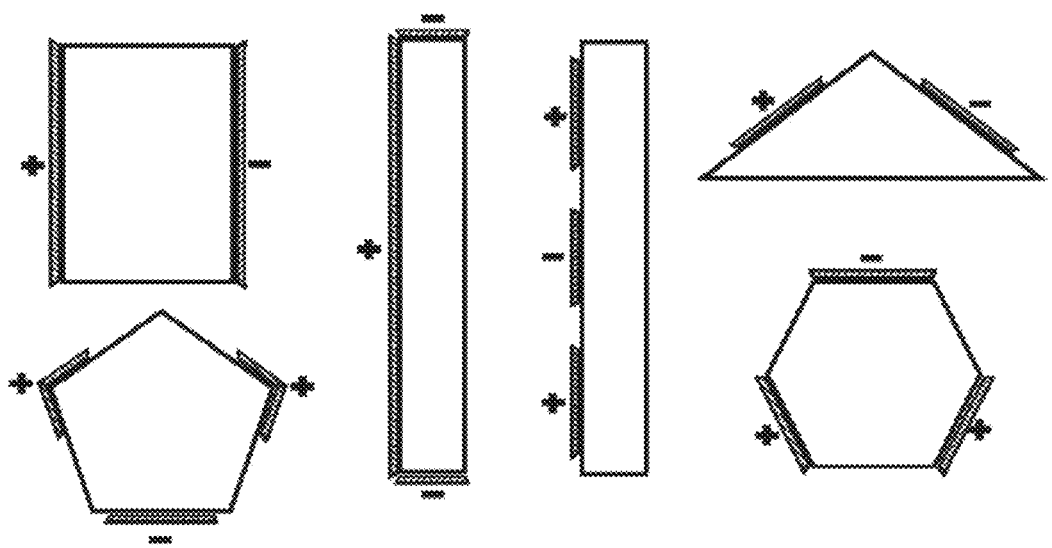
FIG. 4 is a schematic diagram illustrating an example of contact design with a maximum fill factor.

Next, an individual panel layout may be designed while ensuring the light-emitting area under the threshold, and then arrays of panels on the mother substrates may be designed. When the size of the panel is reduced, it is important to ensure a decent fill factor, i.e., a ratio of the light-emitting area to the entire area of the panel. Otherwise, the amount of panels produced per mother substrate decreases and causes increase of manufacturing cost. Nevertheless, an advantage of fabricating panels with smaller active area is the elimination of bus lines which are normally inserted in between organic layers and ITO to enhance luminance uniformity for large-area panel (U.S. Pat. No. 8,927,308B2). Since the light-emitting area is reduced, the luminance uniformity is improved, and the bus lines which increase the manufacturing cost, potential shorting as well as non-emissive area are not necessary. In addition, due to the reduction of light-emitting area and the improvement of luminance uniformity, contact electrodes may be designed with minimum quantity so as to increase fill factor. With a proper panel design, up to 3 edges of a tetragon panel may be free of electrical contacts while maintaining a decent luminance uniformity. Some examples of contact electrode design are shown in, but not limited to, FIG. 4. In FIG. 4, symbol "+" represents the anode contact and symbol "−" represents the cathode contact. As will be described below in detail, with flexible printed circuit (FPC) sheet bonding technique, areas of the contact electrodes may be greatly reduced so as to further enhance the fill factor. Detailed panel design rules are not described in the present disclosure, yet are known to those skilled in the art. Further enhancement of fill factor may be achieved by improving encapsulation method. The conventional cover glass encapsulation scheme occupies the space, however, bezel-less format may be achieved with thin film encapsulation (U.S. Pat. No. 8,933,468B2). To further reduce cost, thin film encapsulation may be printed or sprayed onto the substrates (U.S. Pat. No. 9,343,678B2). Such printed or sprayed encapsulation layer may also be used in the bank material, in this way, so that in theory no photolithography step is needed which is considered a high cost fabrication step. Another scheme to pattern the bank layer is to use inorganic materials, including, but not limited to, silicon oxide or silicon nitride through the shadow mask or photolithography after an overall PECVD coating. The lifetime of the device may be enhanced by replacing organic materials with those inorganic materials.

The above panels may be arranged in arrays on a large-area mother substrate for fabrication. The array layout may accommodate the shapes of individual panel, the position of the contact electrode of each panel, and the capability of manufacturing tools. Such arrangement knowledge is well known to those skilled in the art. It is to be noted that such array arrangement is only a part of fabrication process, and each panel will be diced from the mother substrate after the fabrication is completed. This is not to be confused with the panel distribution layout for the final module as described below. In theory, each panel may also be manufactured individually, i.e., the substrate of each panel is the mother substrate. Each individual panel may be in any shapes, regular or irregular, so long as they may be arranged on the mother substrate with the maximum utilization.

Figure 5A:
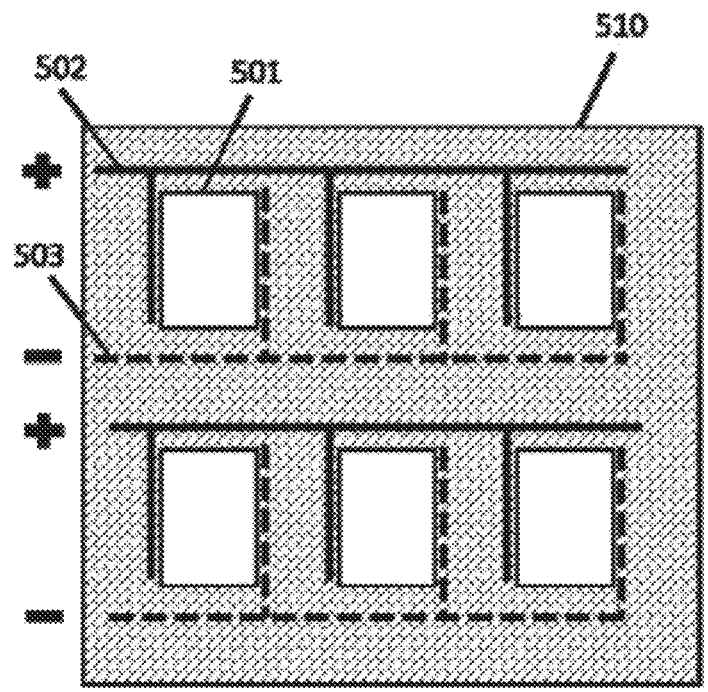
FIG. 5a is a schematic diagram illustrating a portion of an example of a circuit layout on FPC.
Figure 5B:
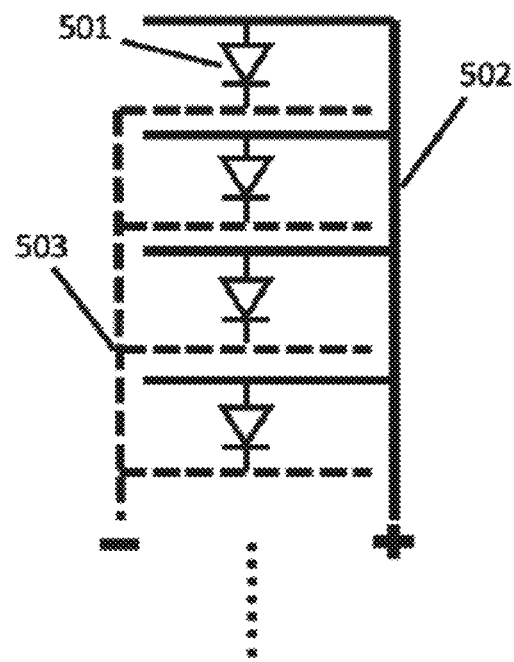
FIG. 5b is a schematic diagram illustrating a corresponding schematic of an OLED luminaire where OLED panels are electrically connected in parallel.
Figure 6A:
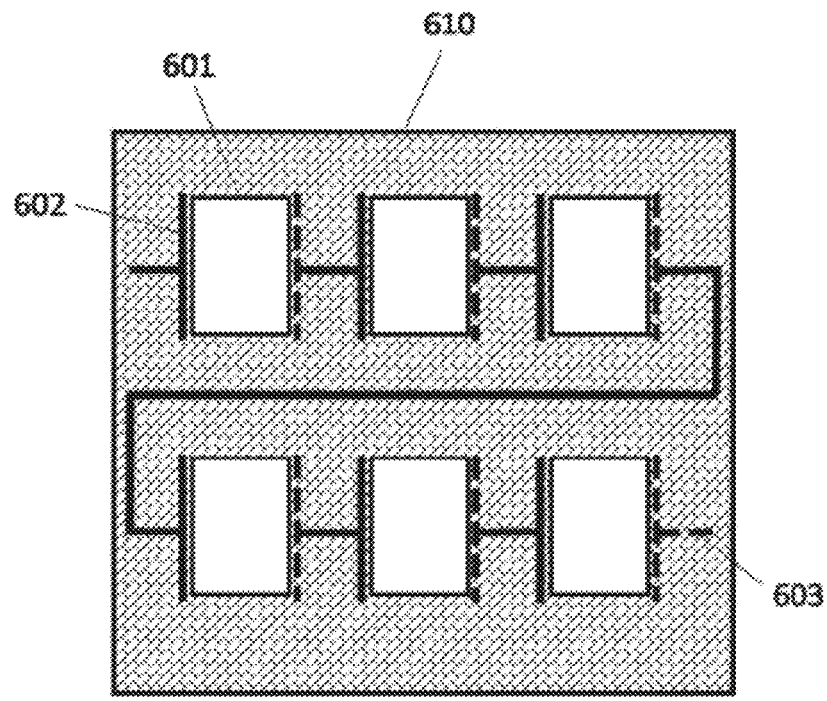
FIG. 6a is a schematic diagram illustrating a portion of an example of a circuit layout on FPC.
Figure 6B:
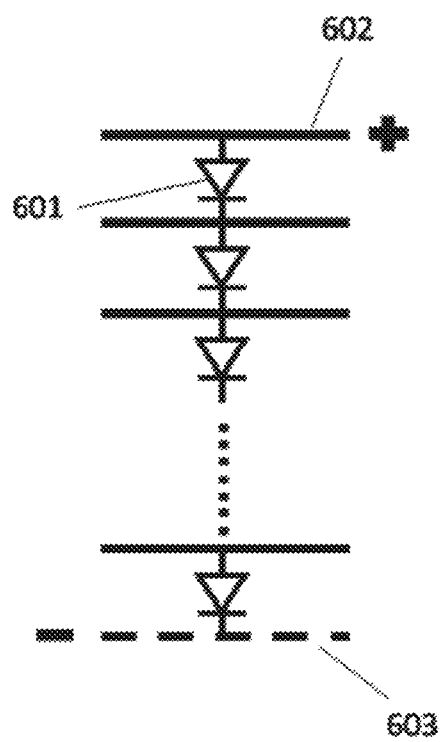
FIG. 6b is a schematic diagram illustrating a corresponding scheme of an OLED luminaire where OLED panels are electrically connected in series.

The present disclosure further provides a novel method for bonding contact electrodes which reduces non-emitting area. A piece of flexible printed circuit sheet with pre-printed circuits may be used for bonding with the panels. Printed electronics are a mature technique that are able to print copper, silver, TCOs or conductive organic materials onto plastics at a low cost. The recent progress shows that more complicated elements and components may also be obtained by printing, such as a thin-film transistor (TFT) and circuits built upon these TFTs. The width of these conductive lines varies from tens to hundreds of micrometers which may significantly reduce the area required for contact electrodes of the OLED panels. The FPC sheets are usually very thin, generally ranging from 12 to 125 µm. Some FPC sheets may be transparent. In addition to driving circuits for OLEDs, other electronic elements, such as, but not limited to, antenna, amplifier, transmitter, may also be printed on the FPC sheets. A portion of a circuit layout example for electrical connection and driving OLED panels are drawn in FIG. 5a and a corresponding circuit schematic is in FIG. 5b. A plurality of OLED panels 501 are assembled on the FPC sheet 510. Each OLED panel 501 has an anode contact on one end and a cathode contact on the opposite end. The anode contact of each OLED panel 501 is electrically connected to addressing lines 502, and the cathode contact is electrically connected to addressing lines 503. In this configuration, the OLED panels 501 are connected in parallel. A portion of another circuit layout example is drawn in FIG. 6a, and a corresponding circuit schematic is in FIG. 6b, in which OLED panels 601 are electrically connected in series on a FPC sheet 610. Addressing line 602 is connected to an anode of the first OLED panel, and addressing line 603 is connected to a cathode of the last OLED panel. These two examples are ideal for a panel with opposite-polar electrodes on each side of the panel. Panels with other contact electrode designs may nevertheless be able to accommodate such layout, or other circuit schematics. Owing to the fine print of FPC, individual driving of each OLED may be realized. In this way, each OLED panel may be driven at a different operation point so as to achieve high uniformity, intentional luminance difference, or longer lifetime. The contact electrodes of the OLED panels may be bonded to the FPC sheet through camera with high-precision alignment. Designing circuits for connecting the plurality of panels on the FPC is a basic technique in the field of electrical engineering and should be known to those skilled in the art. The FPC sheet may acquire power supply externally in a manner such as, but not limited to, power cables, power plugs, internal batteries, power controller or wireless charging, etc.

Figure 7A:
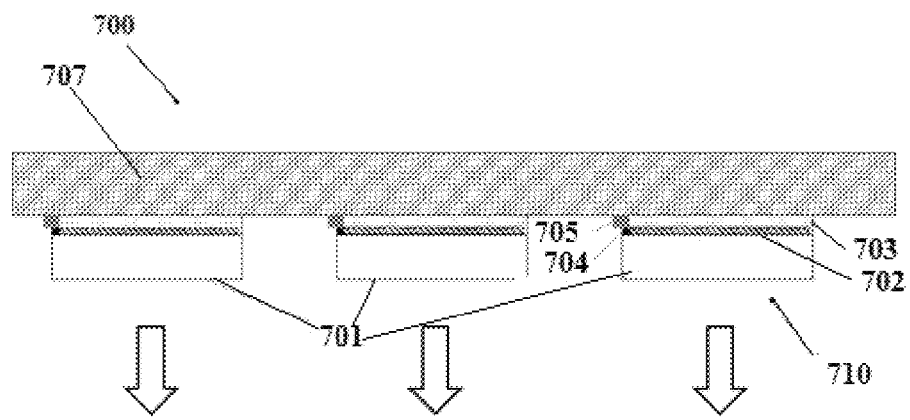
FIGS. 7a to 7e are schematic diagrams illustrating an OLED tile with multiple bottom-emission OLED panels, where there is no thin-film encapsulation layer on FPC sheet in FIG. 7a, there is no light extraction layer in FIG. 7b, there is one light extraction layer in FIG. 7c, there is an individual light extraction layer in FIG. 7d and there is a supporting film in FIG. 7e.
Figure 7B:
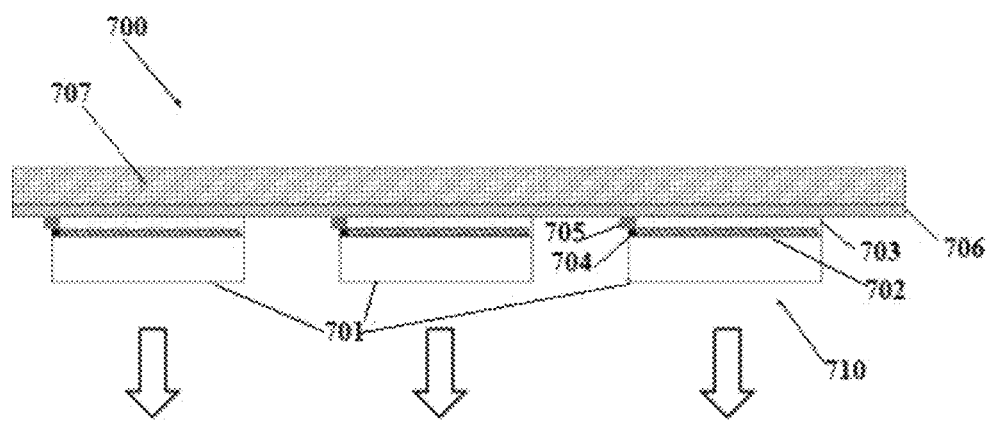

A plurality of OLED panels may be bonded to one FPC sheet with spaces in between. FIG. 7a illustrates an OLED tile module 700 with multiple bottom-emission OLED panels 710 assembled on a FPC sheet 707. Each OLED panel 710 includes a substrate 701, an OLED device 702, at least a pair of contact electrodes 704 including at least one anode contact and one cathode contact, and an encapsulation layer 703. The encapsulation layer 703 may be a cover glass glued to the substrate by UV cured epoxy. The encapsulation layer 703 is preferably to be a thin-film encapsulation layer less than 100 µm thick. Each OLED panel 710 is bonded to the FPC sheet 707, on which a circuit is pre-printed, through a bonding structure 705. The OLED panels may be bonded to the printed circuit sheet through thermal or pressure bonding. The bonding structure 705 may be, but not limited to, conductive epoxy with metal particles, wire bonding, soldering or any other bonding structures that are known to those skilled in the art. The bonding may be, but not limited to, pressure activated, thermal activated, UV activated or the combination of thereupon. In order to bond the multiple OLED panels at the same time, it may be desired to provide a platform where the FPC sheet is placed, and a robot transfer arm is used to pick up the OLED panels and place them onto a designated location of the FPC sheet. The bonding structure may be manufactured before the OLED panels are placed. For example, if conductive epoxy is used for bonding, a dispenser may be assembled in the system to dispose the epoxy at designated locations. If the epoxy is UV activated, a UV light source is used to shine light to the bonding region after panels are placed on the glue. In another pressure activated scheme, a fixture corresponding to the epoxy contour may be pressed down on the relocated OLED panel. A heating device may further be integrated in the system for elevating temperature to assist bonding. The platform itself may be a hot plate, or groves may be embedded with thermal wires at the corresponding locations of the epoxy contour. The epoxy dispensing, the robot transfer arm, UV exposure, pressing fixture, and/or the heating device may all be assembled in one robot system. For high precision, alignment camera may be also integrated. It is to be noted that the above are just bonding examples, and various bonding schemes are well known to those skilled in the art. In addition, a thin-film encapsulation layer 706 may be coated between the FPC sheet 707 and the OLED panels 710, as shown in FIG. 7b.

Figure 7C:
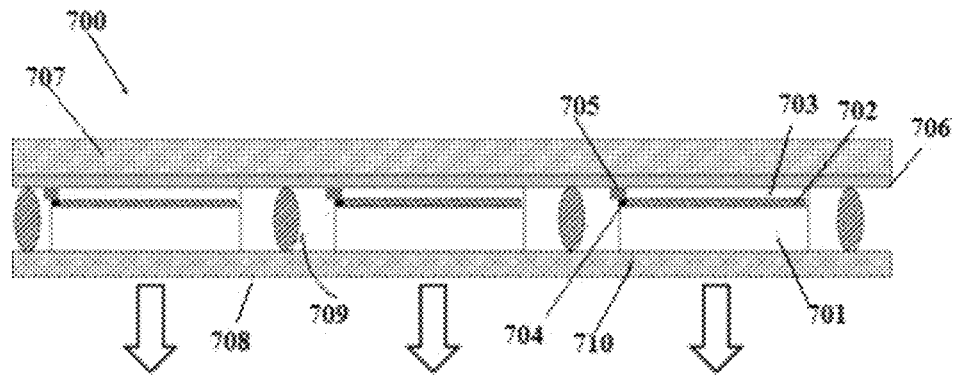
Figure 7D:
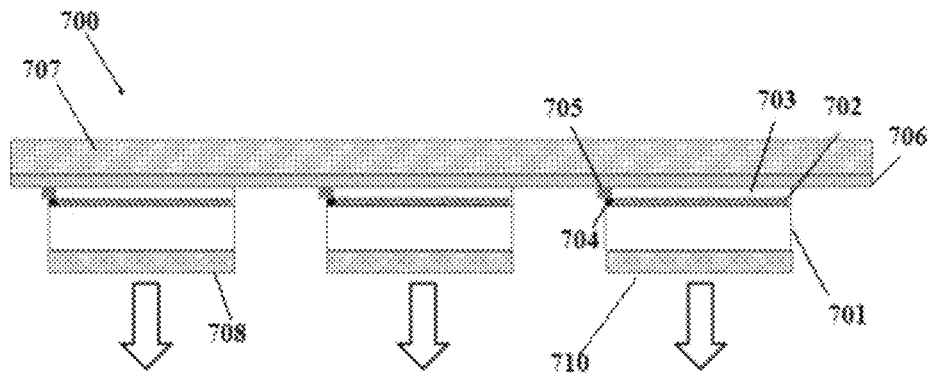
Figure 7E:
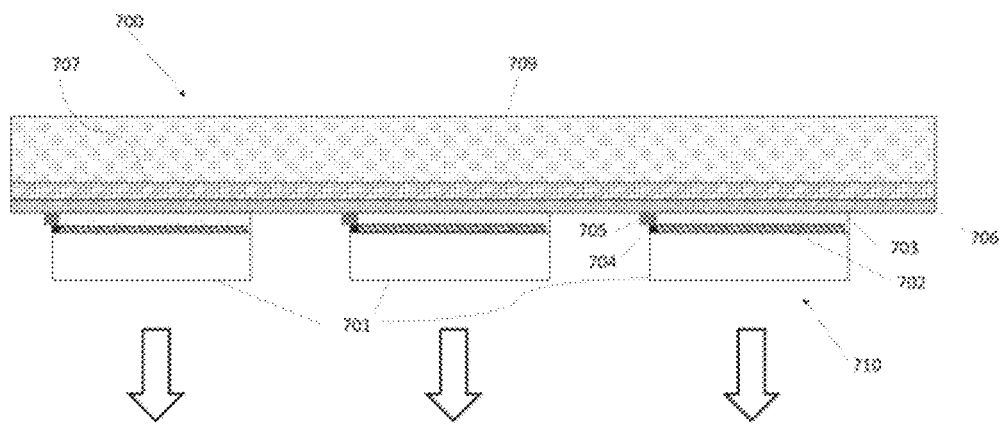

In this embodiment, light emits from one side of the substrate, which is opposite to the encapsulation side, such considered as a bottom-emission device. In FIG. 7c, a light extraction layer 708 may be laminated to the OLED panels 710 for enhancing the light extraction effect. The light extraction layer 708 may be a diffuser sheet with adhesives. The light extraction layer 708 may also be a thin-film coated on the light-emitting surface of the substrate. Additional adhesives 709 may be inserted between the light extraction layer 708 and the FPC sheet 707, but is not necessary. The light extraction layer 708 may also be separated for each OLED panel, as shown in FIG. 7d. If the FPC sheet is very thin, a supporting film 719 may be laminated to a side of FPC sheet opposite to the emitting surface of the OLEDs, as shown in FIG. 7e. The supporting film 719 may have adhesives.

Figure 8A:
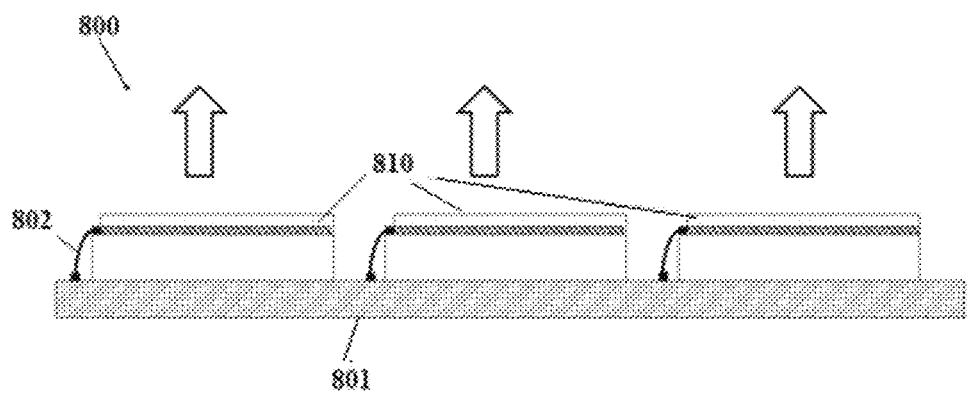
FIGS. 8a to 8b are schematic diagrams illustrating an OLED tile with top-emission OLED panels, where there is no light extraction layer in FIG. 8a and there is a light extraction layer in FIG. 8b.
Figure 8B:
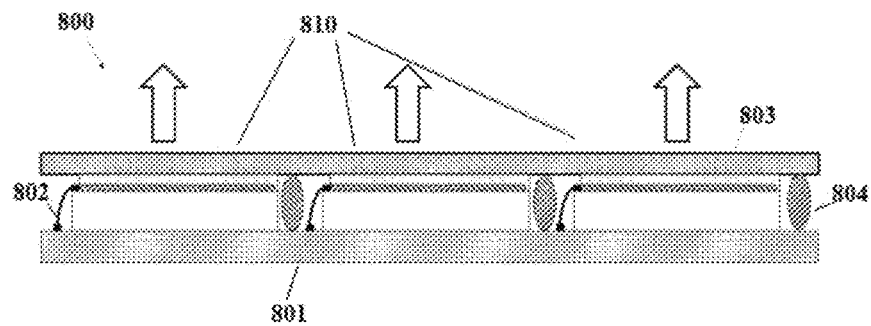
Figure 9A:
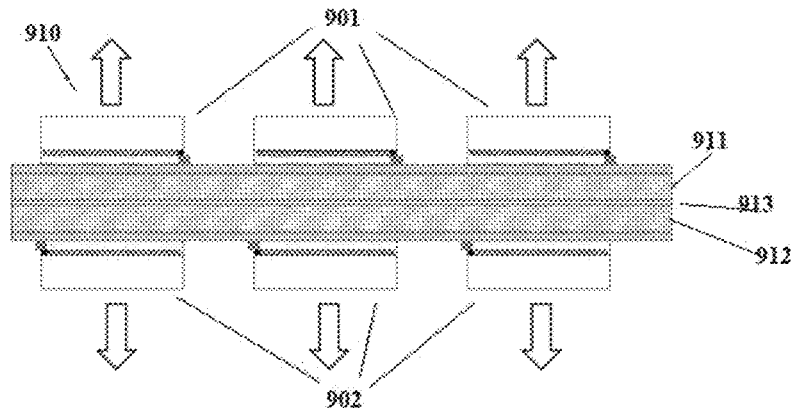
FIGS. 9a to 9c are schematic diagrams illustrating a lighting luminaire with double-sided OLED panels, where two bottom-emission OLED lighting tiles with aligned OLED panels are used in FIG. 9a, two bottom-emission OLED lighting tiles with alternating OLED panels are used in FIG. 9b and a double-sided FPC sheet is used in FIG. 9c.
Figure 9B:
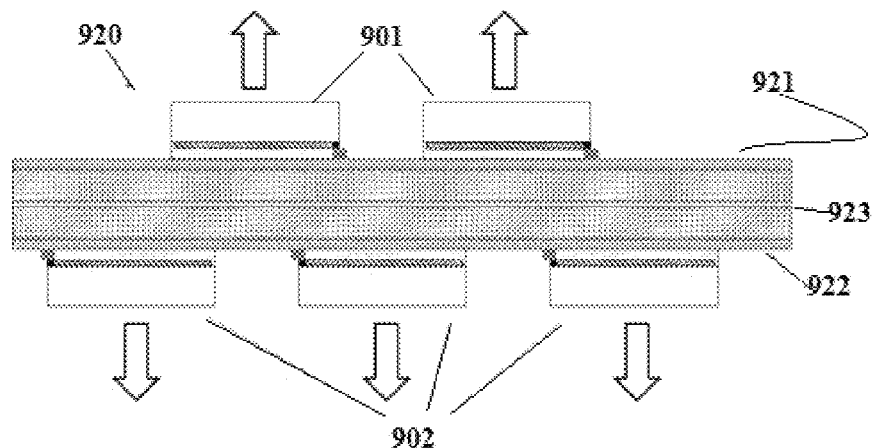
Figure 9C:
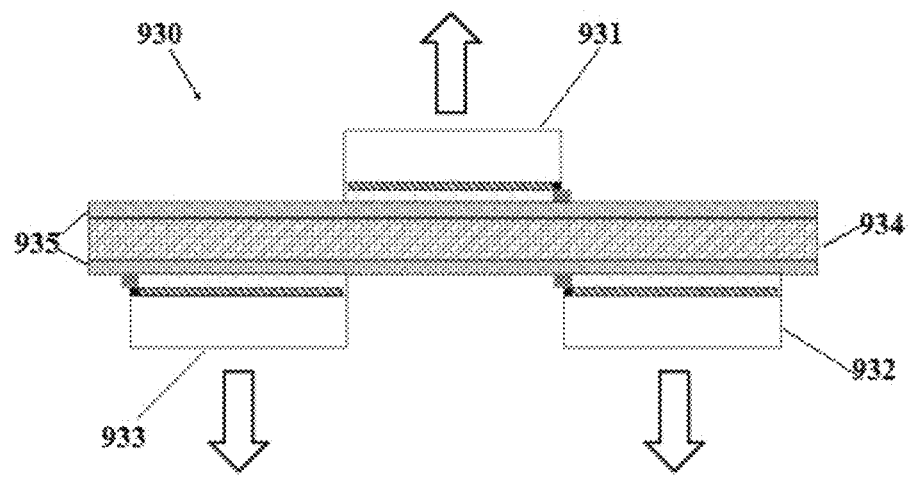

In other embodiments, top-emission devices may be assembled into a lighting tile. FIG. 8a illustrates a OLED tile module 800 including a plurality of top-emission OLED panels 810. In this structure, light emits from the encapsulation side of OLED panels 810. Each OLED panel 810 is bonded to a FPC sheet 801 through a bonding structure 802. Similarly, as shown in FIG. 8b, a light extraction layer 803 may be added on top of the OLED panels 810 since the light-emitting surface is opposite to the substrate. Additional adhesives 804 may be inserted between the FPC sheet 801 and the light extracting layer 803. In some embodiments, two bottom-emission OLED tile modules may be laminated back to back to form a double-sided lighting emitting module, as shown in FIG. 9a. In FIG. 9a, a first bottom-emission OLED tile module 911 may be bonded to a second bottom-emission OLED tile module 912 through an adhesive 913 disposed in between the FPC sheet of these two tiles, to form a double-sided lighting emitting module 910. The OLED panels 901 on the tile module 911 and the OLED panels 902 on the tile module 912 may be well aligned. In another scheme, OLED panels 901 on an OLED tile module 921 and OLED panels 902 on an OLED tile module 922 may be alternatively aligned, such that a module 920 may emit light from both sides without any gap, as shown in FIG. 9b. In another embodiment (as shown in FIG. 9c), the FPC sheet may have printed circuits on both sides, a plurality of OLED panels may be electrically connected to the FPC sheet on both sides. Here, a double-sided lighting-emitting tile module 930 may include one FPC sheet 934. The FPC sheet 934 has circuits printed on both sides, such that an OLED panel 931 may be electrically boned to one side of the FPC sheet 934, while OLED panels 932 and 933 are boned to the other side of the FPC sheet 934. A thin-film encapsulation layer 935 may be added on both sides of the FPC sheet 934. Similarly, additional light extraction layers may be added on top of the OLED panels, which is not drawn here.

Figure 10A:
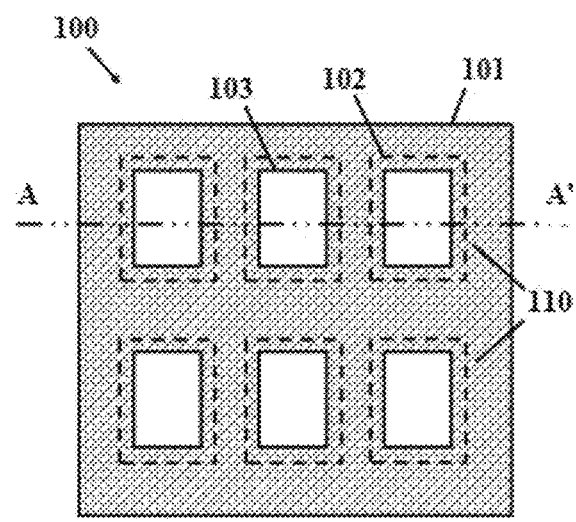
FIG. 10a is a plane view of a portion of an OLED lighting tile.
Figure 10B:
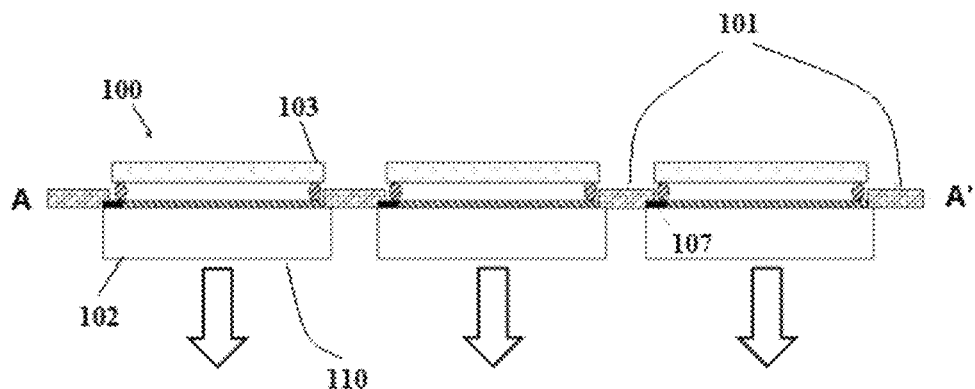
FIG. 10b is a corresponding cross-section view along a line A-A' in FIG. 10a without a light extraction layer.
Figure 10C:
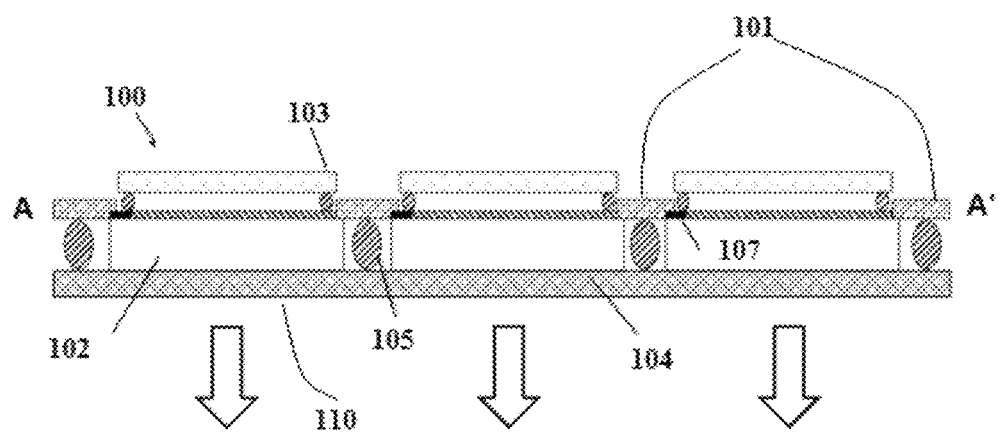
FIG. 10c is a corresponding cross-section view along a line A-A' in FIG. 10a with a light extraction layer.
Figure 11A:
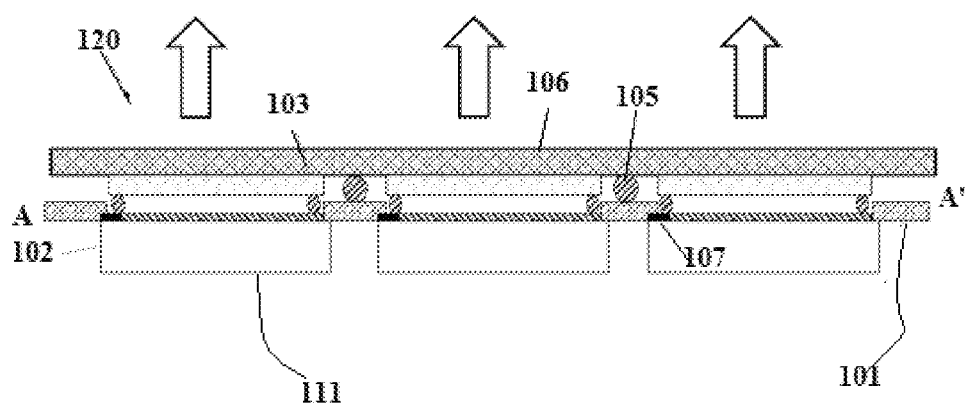
FIGS. 11a and 11b are schematic diagrams illustrating a portion of an OLED light tile, where top-emission OLED panels are assembled on a mesh-like FPC sheet in FIG. 11a and transparent OLED devices are assembled on the mesh-like FPC sheet in the same configuration in FIG. 11b.
Figure 11B:
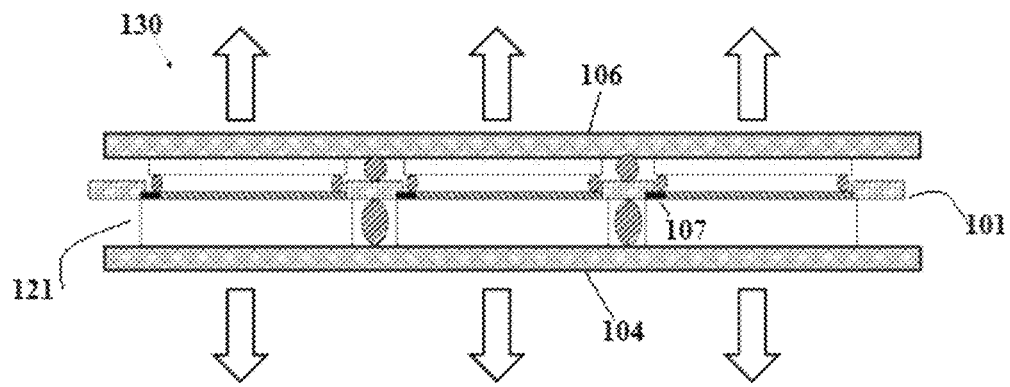

In some embodiments, the FPC sheet may be non-continuous, and more preferably, in a mesh or grid shape. FIG. 10a is a top view illustrating a portion of an OLED lighting tile module 100. A plurality of OLED panels 110 are assembled on a FPC sheet 101. Each OLED panel has a substrate 102 and a cover glass 103 as an encapsulation layer. It is to be noted that although cover glass encapsulation is drawn in FIG. 10a, any other encapsulation schemes, such as thin-film encapsulation, may be applied here, and its contour may be represented by 103. A corresponding cross-section view along line AA' in FIG. 10a is shown in FIG. 10b. Here, the FPC sheet 101 has a grid structure, such that the FPC sheet 101 does not overlap or be in contact with the cover glass 103, and only in electrical contact with the OLED panels 110 through a bonding structure 107. In this example, the OLED panels 110 are bottom-emission devices. Similarly, a light extraction layer 104 may be attached to the FPC sheet 101 through an optional adhesive 105, as shown in FIG. 10c. One advantage of such grid FPC sheet is to integrate bottom-emission, top-emission, and transparent OELD panels by using the same bonding technique, thereby reducing the manufacturing cost. This is because the common FPC sheet is non-transparent. Even though some FPC sheets are transparent, the optical quality thereof is too poor to allow decent light transmission. When the FPC sheet covers neither the substrate nor the encapsulation layer, light may be allowed to travel in either direction. For example, FIG. 11a illustrates an OLED tile module 120 in which a plurality of top-emission OLED panels 111 are assembled on a FPC sheet 101 by using a bonding structure 107 same as that used in FIGS. 10b and 10c. Since the OLED panels 111 emit light through the encapsulation layer, a light extraction layer 106 may be disposed on top of the encapsulation layer. In addition, transparent OLED panels 121 that emit light from both sides (as shown in FIG. 11b), may be assembled on the FPC sheet 101 through the same configuration, thereby forming a double-sided light-emitting tile 130. In such structure, one light extraction layer 104 may be disposed on the side of the substrate and another light extraction layer 106 may be disposed on the side of the encapsulation layer. Light extraction layers 104 and 106 may or may not be the same type.

The substrates of such OLED panels may be rigid glass, or flexible substrates, such as, but not limited to, Polyimide (PI), polyethylene terephthalate (PET), Polyethylene naphthalate two formic acid glycol ester (PEN), a metal thin film, fabric, etc. The final size of the OLED tile module is determined by market demands. For example, 1 meter by 1 meter may be used in Asian countries while six feet by six feet in North America (PNNL, OLED lighting products). The OLED panels on these tile modules may have any geometric shape as long as they can be electrically connected on the FPC sheet. These OLED panels having different geometric shapes may be manufactured from different mother substrates.

Assuming that each panel is a square with a light-emitting area of 43 $cm^2$, 50 µm spacing is reserved from an edge of the light-emitting area to an edge of the substrate on three sides of the square, and 50 µm encapsulation space, plus 500 µm space for the contact electrode on the remaining edges. A total substrate size of the panel is 43.45 $cm^2$ with a fill factor close to 99%. If the mother substrate is a 6th generation (Gen 6) production line, it is roughly calculated that each mother substrate may produce almost 600 pieces of such panels. And according to the previous estimation, the yield is theoretically 100%. These 600 pieces of panels will be diced after encapsulation into independent panels, and then be bonded to the FPC sheet to form an OLED tile or belt module. Finally, a thin-film diffuser sheet may be attached to the light-emitting side to enclose the entire module. The light-emitting side may either be the substrate side for bottom-emission devices or the encapsulation side for top emission devices. On the contrary, if a panel with the light-emitting area of 100 $cm^2$ (assuming a 10 cm×10 cm square) is manufactured on a Gen 6 mother substrate (1500 mm×1800 mm), up to 270 pieces of panels may be acquired. If assuming the manufacturing cost of the Gen 6 mother substrate is Q, the yield for panels of 100 $cm^2$ is 50%, the yield for panels of 43 $cm^2$ is 90%, then the cost for manufacturing a good panel of 100 $cm^2$ is Q/135, and that of 43 $cm^2$ is Q/540. This is already 4 fold cost reduction. In fact, most of OLED manufacturers still use small-scale production lines for lighting applications, for example, LG Chem still uses a 2th generation (Gen 2) production line (370 mm×470 mm). Through the Gen 2 production line, only 12 pieces of panels of 100 $cm^2$ can be produced. Then the cost for manufacturing a single panel rapidly rises to Q/6 (assuming that the manufacturing cost of Gen 6 and Gen 2 production line are similar in the long term). Therefore, by increasing the size of the mother substrate and decreasing the size of the individual panel, the cost may be reduced by more than 200 times. Even if some defective panels may be found after dicing, they may still be screened out before the final assembly. In this way, the yield of the final module will be higher.

Such rule of thumb for manufacturing the OLED panels have been practiced in the lab. The lab is used for depositing organic layers onto a provided ITO coated glass substrate. As described above, particles are most critical in organic layer deposition, so only this lab is taken into the estimation. Particles are counted first, and table 1 lists the measurement result. 9 tests were performed at various locations in the lab. The average count M of particles the diameter of which is equal to or greater than 0.3 µm was calculated to be 151 per cubic feet. Based on Eq. 1, it may be deducted that a threshold area A of the active area is close to 33 $cm^2$. Taking this number as a guideline, an OLED panel with the active area of 21 $cm^2$ is designed. Except for ensuring that the active area is less than the threshold area, the maximum capacity of the mother substrate (6 inch by 6 inch square) is also considered while choosing such active area. 90 pieces of OLED panels are fabricated in this lab. The thickness of the organic layer of each panel is within 0.2 µm. The number of failure panel due to particles is 5 out of 90 and the yield is 94.4%. It is to be noted that the fabrication is done in a semi-automated lab where particles introduced by human operations is inevitable. The yield should be higher in a fully-automated production factory.

TABLE 1

Particle counting results in an OLED deposition lab

| Particle diameter | Particle counting (number/per cubic feet) | | | | | | | | |
|---|---|---|---|---|---|---|---|---|---|
| [μm] | Test 1 | Test 2 | Test 3 | Test 4 | Test 5 | Test 6 | Test 7 | Test 8 | Test 9 |
| 0.3-0.5 | 309 | 107 | 97 | 49 | 31 | 35 | 28 | 18 | 11 |
| 0.5-1.0 | 118 | 76 | 82 | 40 | 24 | 32 | 19 | 13 | 10 |
| 1.0-3.0 | 61 | 43 | 35 | 20 | 10 | 14 | 11 | 5 | 5 |
| 3.0-5.0 | 15 | 5 | 4 | 6 | 6 | 3 | 3 | 0 | 2 |
| 5.0-10 | 2 | 0 | 1 | 3 | 4 | 0 | 2 | 0 | 1 |
| >10 | 1 | 0 | 0 | 0 | 0 | 0 | 0 | 0 | 0 |
| Total | 506 | 231 | 219 | 118 | 75 | 84 | 63 | 36 | 29 |
| Average | | | | | 151 | | | | |

Figure 12:
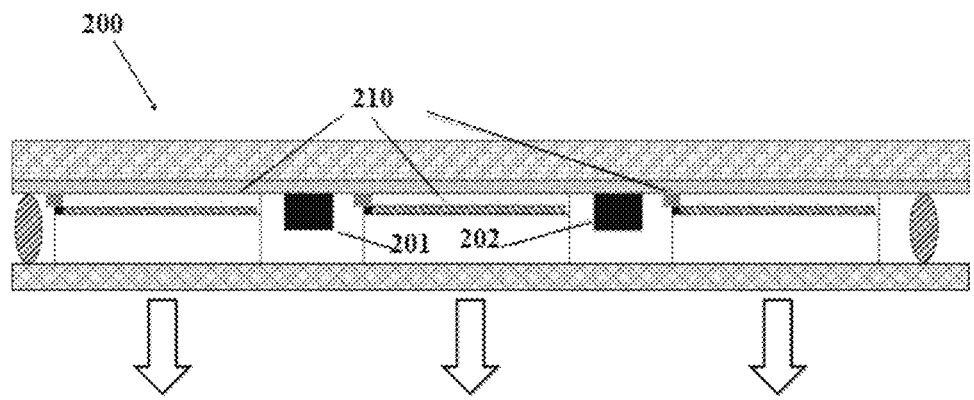
FIG. 12 is a schematic diagram illustrating an OLED lighting tile with sensors being assembled between lighting panels.

In some embodiments, each individual good OLED panel may be assembled next to each other on the FPC sheet. It should be remembered that although these panels may be physically contact each other, their substrates are separated, i.e., two substrates do not form to a coherent object. Alternatively, these OLED panels may be placed apart from each other with at least 0.1 mm space in between, more preferably, with more than 5 mm space in between. In some embodiments, a sensor used for detecting motion or a wireless transmitter used for communicating with other electronic devices may be mounted between OLED panels. For example, FIG. 12 shows an OLED tile module 200 with a plurality of bottom-emission OLED panels 210, and sensors 201 and 202 are inserted between the OLED panels. Sensors 201 and 202 may be the same type of sensors, or have different functions. The functions of sensors 201 and 202 may include, but not limited to, a motion sensor, a sound sensor, an image sensor, a temperature sensor, a gas sensor, a pressure sensor, an infrared sensor and/or a humidity sensor. Such applications may be used in smart lighting or Internet of Things (IoT). In an embodiment, an entire wall or ceiling or window may be covered with one or more OLED tile modules 200. When the sensors 201 and 202 detect human motion in a certain location, the OLED tile modules in this area may be turned on or turned up. For example, when someone enters the room and sits down at the desk, the OLED modules above the desk may light up and dim the rest area. Wireless communication systems may also be integrated into the light-emitting tiles so that remote control may be realized through other electronic devices. In addition, intentional space may be left among panels to generate a specific light distribution. It is well known that OLED lights do not strictly follow Lambertian distribution, especially for micro-cavity devices. This means that the light intensity at different viewing angle is not exactly the same, and typically light at normal incidence is the strongest and the light intensity decreases with the increase of angle. To achieve a more uniform light distribution, OLED panels may be placed with intervals. On the other aspect, a uniform light-emitting surface is very similar to a grey sky and is not desired. Therefore, OLED panels on the tile may be arranged with higher density in a certain area and lower in another, i.e. non-uniformly distributed, to create a variation of light intensity.

In addition to the enhancement of yield, another benefit of dividing one single large area light source into small ones, is that individual RGB colors may be formed instead of one white stack. As is well-known, from a certain distance, human eyes cannot distinguish the differences of RGB pixels from a white background. It also has been demonstrated before that RGB stripes with fuse inserted can form a color tunable white lighting (U.S. Pat. No. 9,214,510B2). In the present disclosure, small pieces of mono-chrome OLED panels may be arranged to form a white lighting tile or belt. In this application, individual red, green and blue panels may be fabricated on different mother substrates and then selected and assembled to the tile. By fabricating the mono-chrome panel separately, each color may use the best device structure to achieve the best device performance (usually the best device structures for red, green and blue OLEDs are not the same) and may be addressed individually through a proper FPC circuit design. Additionally, such fabrication process is much simpler and cheaper than the method of replacing shadow masks and using metal buses (U.S. Pat. No. 9,214,510B2). Similarly, such RGB scheme may realize color tuning to add accent to the lighting feature. When the inserted sensors interact with the environment, the OLED tile module integrated with mono-chrome panels may change from cool white light to warm white light for evening lighting, or from one mono-chrome to another to reflect the environment or human mood, thereby achieving a smart lighting.

Figure 13:
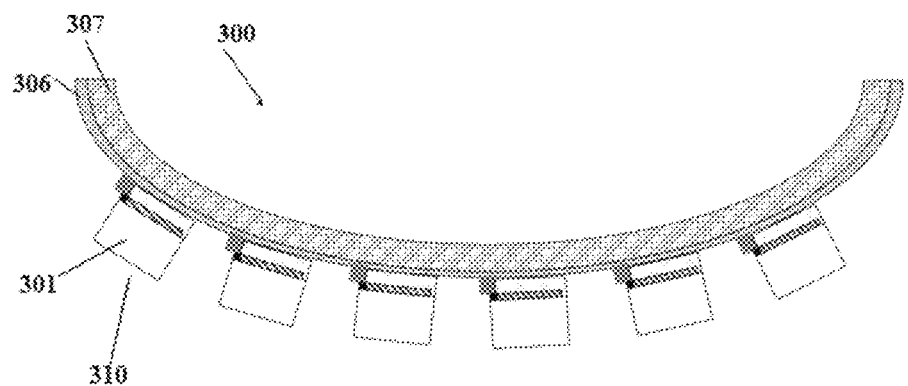
FIG. 13 is a schematic diagram illustrating a large-area flexible OLED tile including multiple rigid OLED panels.

Each OLED panel may be fabricated on glass or on flexible substrates. When rigid glass substrates are used, the final OLED tile modules may still be flexible enough to curve or bend. This is because there is space left between rigid OLED panels which gives the entire tile certain flexibility. On top of that, each rigid panel has a reduced size so that the folding or bending is much more effective. FIG. 13 shows a flexible large-area OLED tile module 300, which includes a plurality of OLED panels 310 assembled on a FPC sheet 307. Each OLED panel 310 has a rigid substrate 301. A thin-film encapsulation layer 306 may be pre-coated on the FPC sheet 307. It can be seen that although each OLED panel 310 is a rigid device itself, the entire tile may still be bent. This is a huge advantage over all rigid tiles where heavy weight and large size adds difficulty and cost in transportation. At the same time, it is also more desired than an entire piece of large-area flexible OLED panel made of an entire flexible substrate, which usually suffers low yield and high cost.

Figure 14:
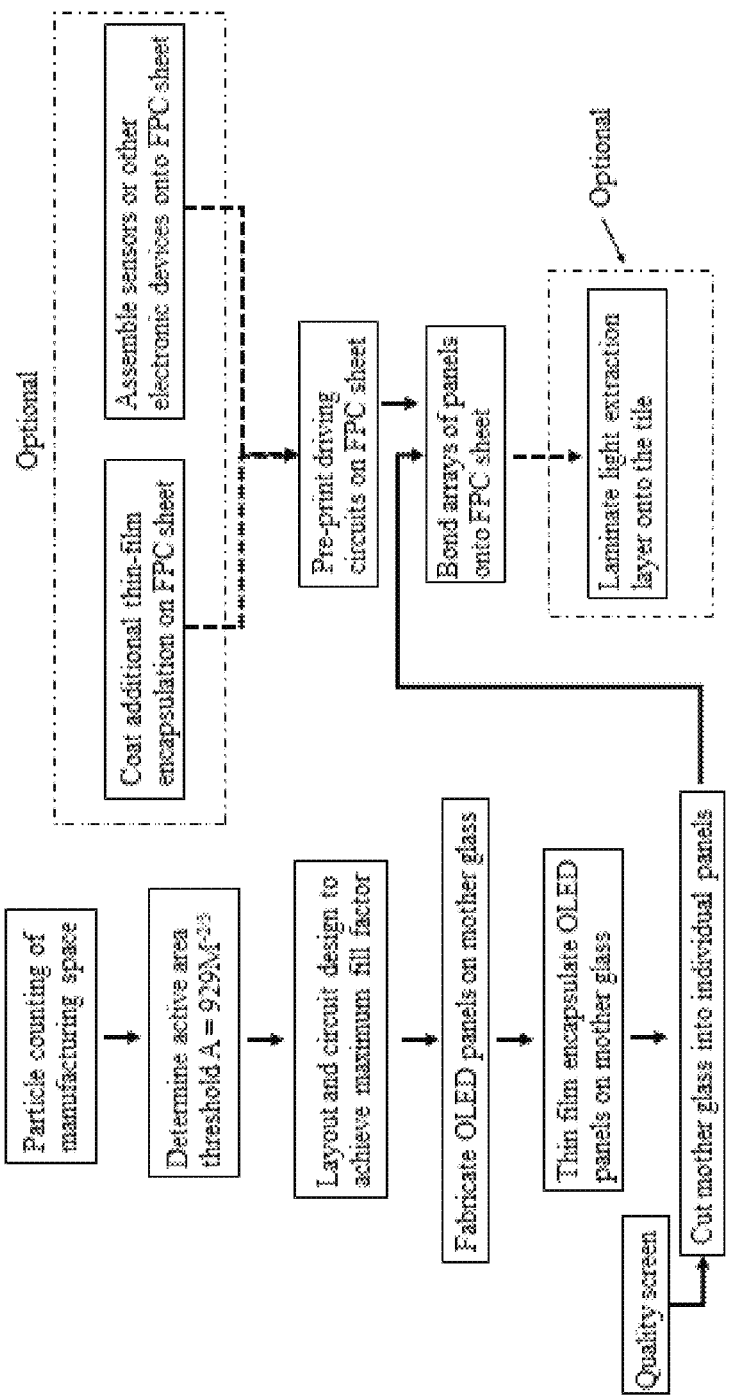
FIG. 14 is a flowchart of a method for manufacturing a high-yield low-cost OLED tile module.

FIG. 14 shows a flowchart of a method for manufacturing an OLED tile module. First, particles the diameter of which is greater than 0.5 μm (more preferably, greater than 0.3 μm) are counted in the manufacturing space for organic layer deposition process. Then, using the formula $A=929M^{-2/3}$ to calculate threshold area of the active area, i.e., the theoretically maximum area where particles the diameter of which is greater than 0.5 μm (more preferably, greater than 0.3 μm) do not exist. Panel layout is designed with a goal of a maximum fill factor. This includes the design of contact electrodes and array arrangement of OLED panels on a mother substrate. After that is the panel distribution design on the tile and a corresponding circuit/driving schematic on the FPC sheet. Next, OLED panels are fabricated on the mother substrate and encapsulated according to the design. The encapsulation is preferred to have at least one edge bezel-less. The mother substrate is then diced to individual panels. A quality control procedure is applied either before or after the dicing to screen out the defective OLED panels. A pre-printed flexible printed circuits (FPC) sheet is simultaneously prepared with the designed circuit and driving schematic. As options, the FPC sheet may further be coated with a thin-film encapsulation layer, or may be pre-assembled with sensors or other wireless communication devices. Finally, these diced individual OLED panels are bonded to the FPC sheet according to the designed circuit layout to form an OLED lighting tile or belt module. The bonding may be completed by a bonding robot where adhesive dispensing, transfer arm, UV exposure, heating element, and/or pressing fixture are assembled in one system. As another option, light extraction layer may be laminated to the emitting side of the completed tile.

It should be understood that various embodiments described here are merely examples and are not intended to limit the scope of the present disclosure. Therefore, it is apparent to those skilled in the art that the claimed disclosure may include variations of specific embodiments and preferred embodiments described in the present disclosure. Many materials and structures described in the present disclosure may be replaced with other materials and structures without departing from the principles of the present disclosure. It should be understood that various theories with respect to why the present disclosure works are not intended to be limitations.

What is claimed is:

1. A method for fabricating an organic light-emitting device (OLED) lighting module, comprising:
    a) determining an active area of one OLED panel; designing panel layout;
    b) designing panel distribution;
    designing a corresponding circuit for the panel distribution and printing the designed circuit on a first surface of a first flexible printed circuit sheet;
    c) fabricating a plurality of OLED panels on at least one mother substrate;
    encapsulating the plurality of OLED panels;
    dicing the at least one mother substrate into individual OLED panels;
    d) electrically bonding at least two individual OLED panels on the first surface of the first flexible printed circuit sheet, wherein the OLED panels are able to be addressed externally;
    wherein a space between substrates of the at least two OLED panels is greater than 0.1 mm; and step b may be implemented before, after or at the same time with step c.

2. The method of claim 1, wherein the active area of the OLED panel is determined by an equation: $A=929M^{-2/3}$, wherein the active area is in a unit of $cm^2$, A is the active area, M is an average number of particles the diameter of which is greater than X µm per cubic feet, wherein X is between 0.1-0.5.

3. The method of claim 1, further comprising providing a light extraction layer, wherein the light extraction layer is configured in one of the follow manners the light extraction layer is a diffuser sheet and is attached to at least one light emitting surface of at least one OLED panel among the plurality of OLED panels; the light extraction layer extends outside of the light emitting surface of at least one OLED panel among the plurality of OLED panels; or the light extraction layer is attached to at least a portion of the first flexible printed circuit sheet.

4. The method of claim 1, wherein the plurality of OLED panels are configured in one of the follow manners: the plurality of OLED panels are thin-film encapsulated; the substrate of at least one OLED panel among the plurality of OLED panels is flexible; at least one OLED panel among the plurality of OLED panels is electrically addressed independently; the plurality of OLED panels are fabricated from two or more mother substrates; or the plurality of OLED panels are pre-screened before assembled on the first flexible printed circuit sheet.

5. The method of claim 1, further comprising: assembling one or more sensors between two OLED panels on the first flexible printed circuit sheet, wherein the one or more sensors comprise one or more of the following: a motion sensor, an image sensor, a sound sensor, a temperature sensor, a gas sensor, a humidity sensor, or an infrared sensor.

6. The method of claim 1, wherein the plurality of OLED panels further comprise a first OLED panel emitting light with a first peak wavelength, a second OLED panel emitting light with a second peak wavelength, wherein a difference between the first peak wavelength and the second peak wavelength is at least 10 nm.

7. The method of claim 6, wherein the plurality of OLED panels further comprise a third OLED panel, wherein the first OLED panel emits light with the first peak wavelength between 400-500 nm, the second OLED panel emits light with the second peak wavelength between 500-580 nm, and the third OLED panel emits light with a third peak wavelength between 580-700 nm.

8. The method of claim 1, wherein the OLED lighting module further comprises a supporting film, wherein the supporting film is attached to at least a portion of a side of the first flexible printed circuit sheet that is not connected to the OLED panels.

9. The method of claim 1, wherein the first flexible printed circuit sheet is configured in one of the following manners: the first flexible printed circuit sheet is overlapped with only a portion of the plurality of OLED panels; the first flexible printed circuit sheet is electrically connected to the plurality of OLED panels through conductive adhesive; the first flexible printed circuit sheet is less than 1 mm thick, or the first flexible printed circuit sheet further comprises a flexible substrate, wherein the flexible substrate is selected from a group composed of: plastic, thin film glass, a thin metal foil coated with insulator, fabric, leather, paper, and a combination thereof.

10. The method of claim 1, wherein each of the plurality of OLED panels comprises a substrate, an OLED device, an encapsulation layer, at least one anode contact, at least one cathode contact, and at least one light emitting surface.

11. The method of claim 10, wherein the OLED device comprises an anode layer, a cathode layer, at least one organic light-emitting layers placed between the anode layer and the cathode layer; and the OLED device does not comprise the substrate and the encapsulation layer that are comprised in the each of the OLED panels.

12. The method of claim 10, wherein a first circuit is printed on the first surface; and at least one anode contact and the at least one cathode contact of at least two OLED panels among the plurality of OLED panels are electrically connected to the first circuit on the first surface of the first flexible printed circuit sheet, so that the plurality of OLED panels are electrically accessed externally.

* * * * *